(12) United States Patent
Kim et al.

(10) Patent No.: US 6,400,636 B1
(45) Date of Patent: Jun. 4, 2002

(54) ADDRESS GENERATOR FOR A SEMICONDUCTOR MEMORY

(75) Inventors: Yeon-Ok Kim; Tae-Hyung Jung, both of Chungcheongbuk-do (KR)

(73) Assignee: Hyundai Electronics Industries Co., Ltd., Kyoungki-Do (KR)

( * ) Notice: Subject to any disclaimer, the term of this patent is extended or adjusted under 35 U.S.C. 154(b) by 0 days.

(21) Appl. No.: 09/638,865

(22) Filed: Aug. 15, 2000

(30) Foreign Application Priority Data

Aug. 25, 1999 (KR) ............................................. 99-35432

(51) Int. Cl.$^7$ ................................................. G11C 8/00
(52) U.S. Cl. .............................. 365/230.06; 365/230.08
(58) Field of Search ................................. 365/201, 214, 365/230.06, 230.08

(56) References Cited

U.S. PATENT DOCUMENTS 5,426,616 A * 6/1995 Kajigaya et al. ............ 365/226
5,515,328 A * 5/1996 Silvestre de Ferron 365/230.03
6,188,619 B1 * 2/2001 Jung ........................... 365/200

* cited by examiner

Primary Examiner—Richard Elms
Assistant Examiner—VanThu Nguyen
(74) Attorney, Agent, or Firm—Fleshner & Kim, LLP

(57) ABSTRACT

The present invention related to a semiconductor memory that prevents malfunctions by simplifying input paths of an address decoder and by controlling an output timing of a decoded internal address signal. The present invention includes an address signal generator producing complementary signals. An external address is inputted to the address signal generator by a first control signal and is latched by a second control signal. A decoder generates an internal address by receiving one of the complementary address signals and by decoding the address signal and its inverted signal.

17 Claims, 5 Drawing Sheets

ADDRESS GENERATOR FOR A SEMICONDUCTOR MEMORY

BACKGROUND OF THE INVENTION

1. Field of the Invention

The present invention is related to a semiconductor device, and in particular, to a semiconductor memory device.

2. Background of the Related Art

An address input path of a semiconductor memory is as following. Once an external address is inputted to the semiconductor memory, a complementary address signal is provided using the external address. The address signal activates a corresponding word line out of a plurality of word lines by being decoded again by an actual decoder.

FIG. 1 shows a circuit of an address signal generator in a semiconductor memory according to the related art. Referring to FIG. 1, a part from which an address signal is actually generated consists of NOR gates 108 and 112 and inverters 110 and 114. In the address generating part of FIG. 1, an external address BXIN0 is transformed into address signals BXT0 and BXB0. The external address BXIN0 is first inputted to an inverter 102. Then, the address BXIN0 is latched. A latch consists of inverters 104 and 106.

An output of the inverter 102 is inputted to the NOR gate 112. An output of the latch, which is the output of the inverter 104, is inputted to the NOR gate 108. The inverter 102 and the inverter 106 of the latch are tri-state inverters that are enabled by an address enabling signal XAEI and its inverted signal.

The inverter 102 is enabled when the address enabling signal XAEI is at low level. The inverter 106 of the latch is enabled when the address enabling signal XAEI is at high level, to latch the external address BXIN inputted through the inverter 102. Namely, during one period of the address enabling signal XAEI, the inputting and the latching operations of the external address BXIN are completed.

An address signal generation enabling signal XAEBI is inputted to the NOR gates 108 and 112 where the address signals BXT0 and BXB0 are generated. A state transition of the address signal generation enabling signal XAEBI occurs sooner than that of the address enabling signal XAEI. The address signal generation enabling signal XAEBI should be at low level so that outputs of the inverter 102 and the inverter 104 of the latch are outputted as address signals BXT and BXB.

Logic gates 122 to 134 have the same structure of the above described logic gates 102 to 114 and operate the same way. Namely, they produce address signals BXT1 and BXB1 using another external address BXIN1. Additional sets of the logic gates may be added to the related art memory in accordance with the number of bits of the address.

FIG. 2 shows an address decoder in a semiconductor memory according to the related art. Referring to FIG. 2, a plurality of internal addresses AX are generated by combining address signals BXT and BXB, which are generated by a corresponding related art address signal generating part as shown in FIG. 1. The internal addresses AX are used for activating word lines so that only a single signal is preferably activated out of a plurality of the internal addresses AX0 to AXn.

In the related art address decoder, an AND gate, which consists of a NAND gate 202 and an inverter 204, receives an address signal BX. In accordance with the combination of the address signals BX, one of the outputs (i.e., four) from the inverters, (i.e., inverter series 204a, 204b, 204c, 204d) is activated to high level, thereby enabling a corresponding word line. An OR gate consisting of a NOR gate 206 and an inverter 208 is an output stage for an internal address. The OR gate outputs an internal address AX (i.e., AX00, AX01, AX02 and AX03) generated by decoding to the word line in a normal mode. Otherwise, the OR gate selects all the word lines by fixing all the internal addresses AX to high level in a test mode. In FIG. 2, when a test signal TEST is on high level, an output of the NOR gates 206 (i.e., NOR gate series 206a, 206b, 206c and 206d) is fixed to low level and the output of inverters 208 series (i.e., AX00, AX01, AX02 and AX03) become high level.

FIG. 3 is a timing diagram of operational characteristics of an address signal generator and an address decoder in a semiconductor memory according to the related art. Referring to FIG. 3, the address signal generation enabling signal XAEBI goes down to low level while the external address BXIN is confirmed. Then, the address enabling signal XAEI goes up to high level. In this case, logic values of address signals BXT and BXB are confirmed as soon as the address enabling signal XAEI goes up to high level because the NOR gates 108, 112, 128, and 132 in FIG. 1 were enabled by the address signal generation enabling signal XAEBI before the address enabling signal XAEI goes to high level. Further, when the address enabling signal XAEI goes to low level, the address signals BXT and BXB are fixed to high level regardless of the logic value of the external address BXIN.

The logic values of the address signals BXT and BXB are complementary to each other. In particular, BXT and BXB are at low and high levels, respectively, when the external address BXIN is at low level. Otherwise, BXT and BXB are at high and low levels, respectively, when the external address BXIN is on high level. As the address signals BXT and BXB are generated, an internal address AX is generated by the related art address decoder. When the NOR gate 206 (i.e., 206a to 206d) in FIG. 2 is not in test mode, an internal signal AX is generated as soon as the address signal BX is generated and free from influence of the test signal TEST as shown in FIG. 3.

As described above, the related art address signal generator and address decoder in a semiconductor memory have various disadvantages. In particular, in the semiconductor memory of the related art, the complementary address signals BXT and BXB generated from the address signal generator are transferred to the address decoder. Then, the address decoder generates an internal address using both address signals BXT and BXB. Therefore, many signal transfer paths occur between the address decoder and the address signal generator. Moreover, the address signal BX is latched while the address input enabling signal XAEI is activated. In addition, an ineffective internal address AX may be generated by an ineffective external address BXIN since the NOR gates in the address signal generator are already enabled by the address signal generation enabling signal XAEBI. In the related art memory device, a malfunction of the memory may occur because of the selection of an incorrect address of an word line.

The above references are incorporated by reference herein where appropriate for appropriate teachings of additional or alternative details, features and/or technical background.

SUMMARY OF THE INVENTION

An object of the present invention is to provide a semiconductor memory that substantially obviates one or more of the problems caused by limitations and disadvantages of the related art.

Another object of the invention is to provide at least the advantages described hereinafter.

Another object of the present invention is to provide a semiconductor memory that reduces improper internal address generation by direct address signal generation in an address signal generator and decoder.

Another object of the present invention is to provide a semiconductor memory that controls signal timing to reduce improper internal address generation.

Another object of the present invention is to provide a semiconductor device that reduces or prevents ineffective internal address from being generated by reducing the signal transferring paths between an address signal generator and a decoder as well as by controlling a signal output timing.

To achieve at least these objects and other advantages in whole or in parts and in accordance with the purpose of the present invention, as embodied and broadly described, the present invention includes a semiconductor memory device having an address signal generator that produces complementary signals when an external address is input to an address signal generator by a first control signal and is latched in the address signal generator by a second control signal and a decoder that generates an internal address by receiving one of the complementary address signals and by decoding the address signal and its inverted signal.

To further achieve the above objects and other advantages in a whole or in parts, and in accordance with the present invention, there is provided a semiconductor memory that includes an address signal generator that produces pairs of complementary signals responsive to receipt of an external address and a decoder that generates an internal address by receiving a selected one of a pair of the complementary address signals and by decoding said selected one of the complementary address signals and its inverted signal.

To further achieve the above objects and other advantages in a whole or in parts, and in accordance with the present invention, there is provided a semiconductor memory that includes a control signal generator that generates a first control signal that controls an input of an external address and a second control signal that controls a latching of the inputted external address, a first logic gate that receives the external address when enabled by the first control signal, a latch that latches an output of the first logic gate when enabled by the second control signal, an address signal generator that generates complementary address signals using outputs of the first logic gate and the latch when enabled by a third control signal, and a decoder that receives a selected one of the complementary address signals and generates an internal address by decoding said selected complementary address signal and its inverted signal, wherein the decoder includes an internal address output stage that receives the internal address and a third control signal and outputs the internal address to a word line according to the third control signal.

To further achieve the above objects and other advantages in a whole or in parts, and in accordance with the present invention, there is provided a decoder circuit for use with a semiconductor memory device that includes a decoder that generates an internal address, wherein the decoder receives only one of each pair of complementary address signals based on an external address for decoding to output the internal address responsive to a first control signal, and wherein the decoder generates a prescribed level internal address responsive to a test control signal.

Additional advantages, objects, and features of the invention will be set forth in part in the description which follows and in part will become apparent to those having ordinary skill in the art upon examination of the following or may be learned from practice of the invention. The objects and advantages of the invention may be realized and attained as particularly pointed out in the appended claims.

BRIEF DESCRIPTION OF THE DRAWINGS

The invention will be described in detail with reference to the following drawings in which like reference numerals refer to like elements wherein.

DETAILED DESCRIPTION OF PREFERRED EMBODIMENTS

Figure 1:
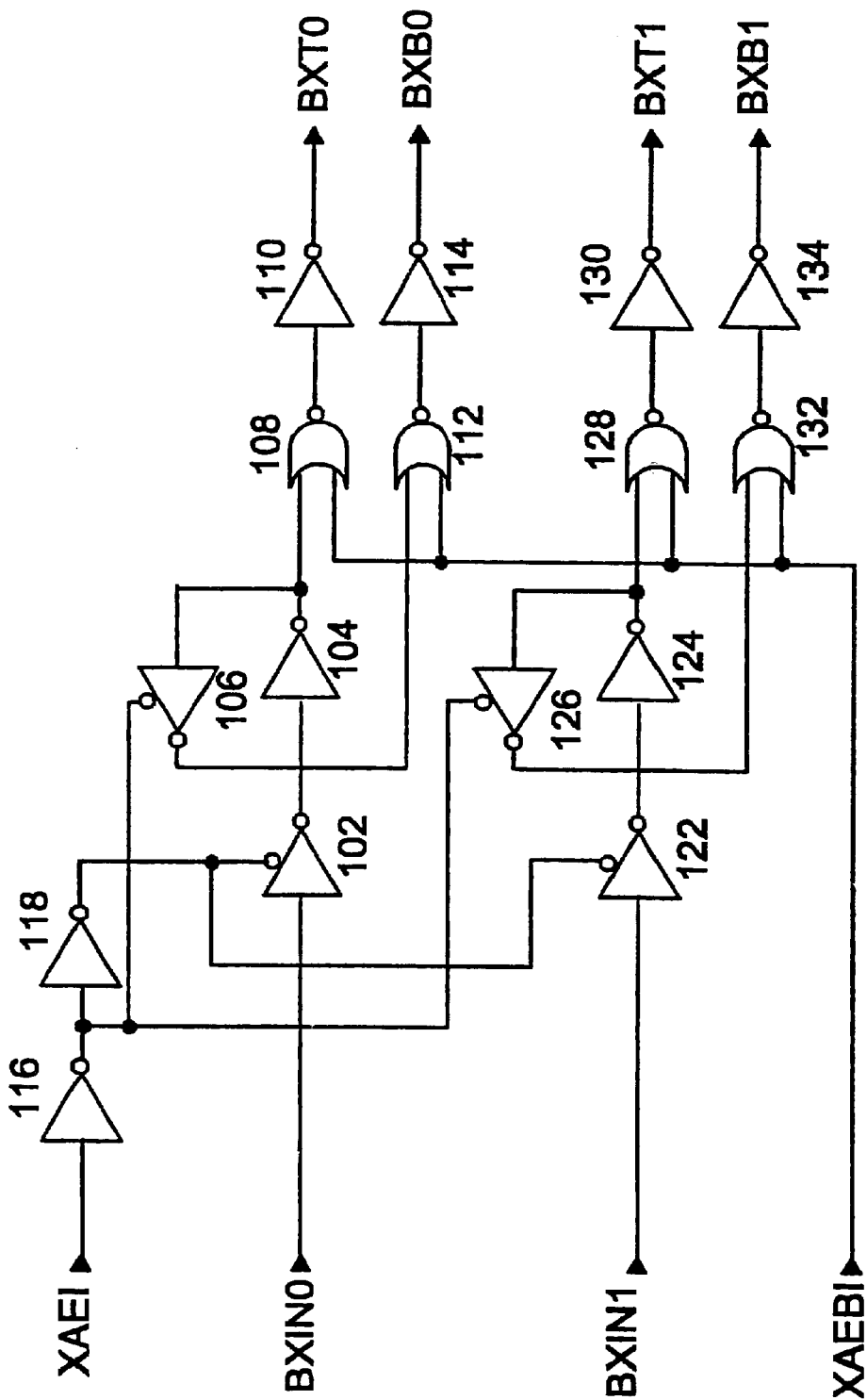
FIG. 1 shows a circuit of an address signal generator in semiconductor memory according to a related art.
Figure 4:
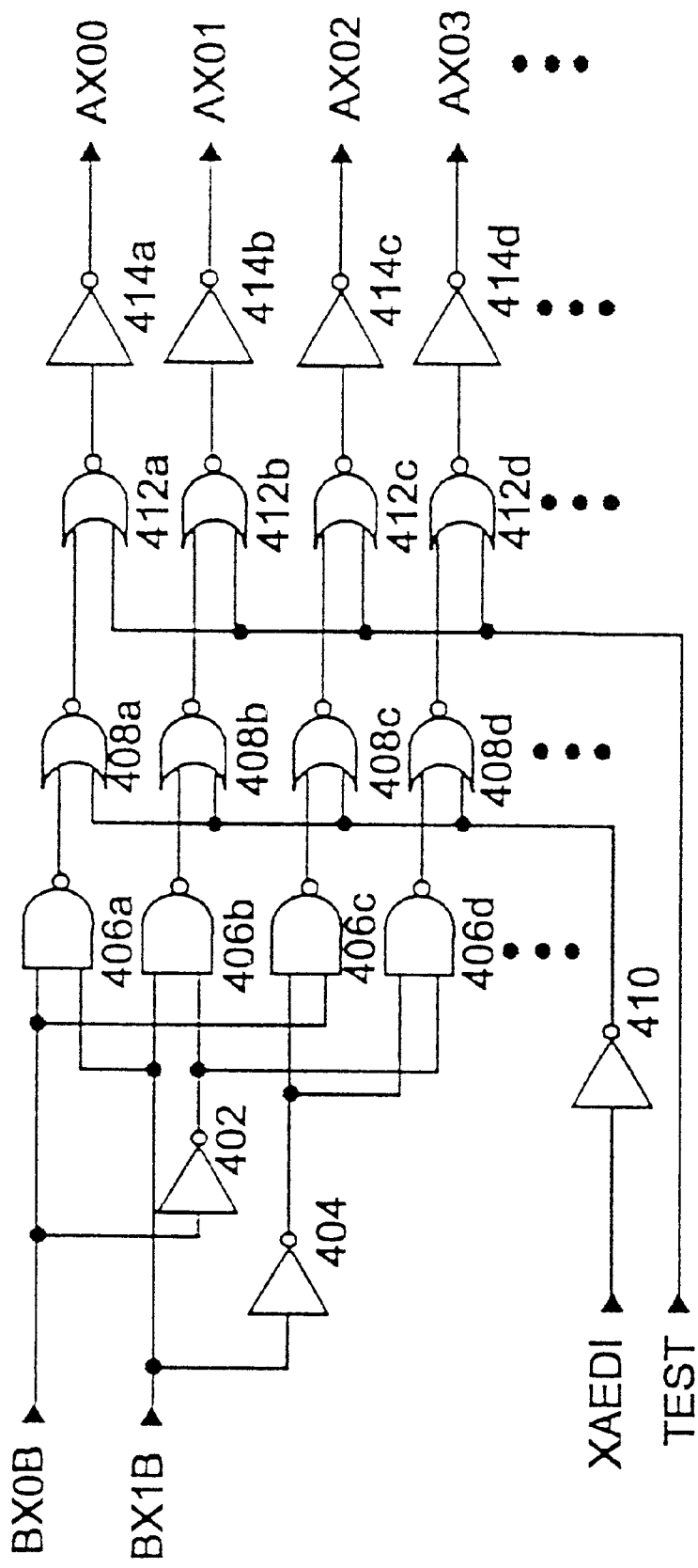
FIG. 4 is a diagram that shows a preferred embodiment of an address decoder in semiconductor memory according to the present invention.

Reference will now be made in detail to the preferred embodiments of the present invention, examples of which are illustrated in the accompanying drawings. FIG. 4 is a diagram that shows a preferred embodiment of an address decoder in semiconductor memory according to the present invention. Referring to FIG. 4, signal transfer paths are arranged to receive a BXnB signal only out of address signals (e.g., BX0B, BX1B, . . . , BXnB) in a decoder according to the present invention. In a preferred embodiment of a semiconductor memory device, an address signal generator may have the same constitution shown in FIG. 1. However, a reason the internal address is generated using the BXB signal only according to the preferred embodiment is that signal transfer paths between the address signal generator and the decoder are reduced. The address signal BXB is preferably decoded by being inverted by inverters 402 and 404.

Preferably, a process of decoding an address signal is actually carried out by a NAND gate 406 (e.g., NAND gate series 406a, 406b, . . . , 406n) and a NOR gate 408. The NOR gate 408 (e.g., NOR gate series 408a, 408b, . . . , 408n) may operate as an inverter by being controlled using a decoding control signal XAEDI.

Therefore, the NAND gate 406 and the NOR gate 408 constitute an AND gate while the decoding control signal XAEDI is on low level. The decoding control signal XAEDI is inputted to the NOR gate 408 upon being inverted by an inverter 410. Namely, the decoding control signal XAEDI should be on high level to enable the preferred embodiment of the decoder.

Timing of an address input enabling signal XAEI of the address signal generator preferably matches the decoding control XAEDI of the decoder to synchronize the operational timings of the decoder and the address signal generator. Accordingly, the address input enabling signal XAEI is preferably used as the decoding control signal XAEDI. Signals outputted from the NOR gate 408 or a NOR gate series 408a, 408b, 408c, . . . , 408n are inputted to a NOR gate 412 or a corresponding NOR gate series 412a, 412b, 412c, ..., 412n. The NOR gate 412 (e.g., NOR gate series 412a, 412b, ..., 412n) and an inverter 414 (e.g., inverter gate series 414a, 414b, ..., 414n) constitute an OR gate, which becomes an output stage of an internal address. The internal address AX (e.g, AX00, AX01, ..., AXn), which is generated by decoding, is output to select a word line in normal mode. However, the internal address output stage selects all word lines in the test mode by fixing all the internal addresses AX or AX00, AX01, ..., AXn to high level. Accordingly, an output of the NOR gate 412 is fixed to low level and the other output of the inverter 414 becomes high level when a test signal TEST is on high level in FIG. 4.

Figure 5:
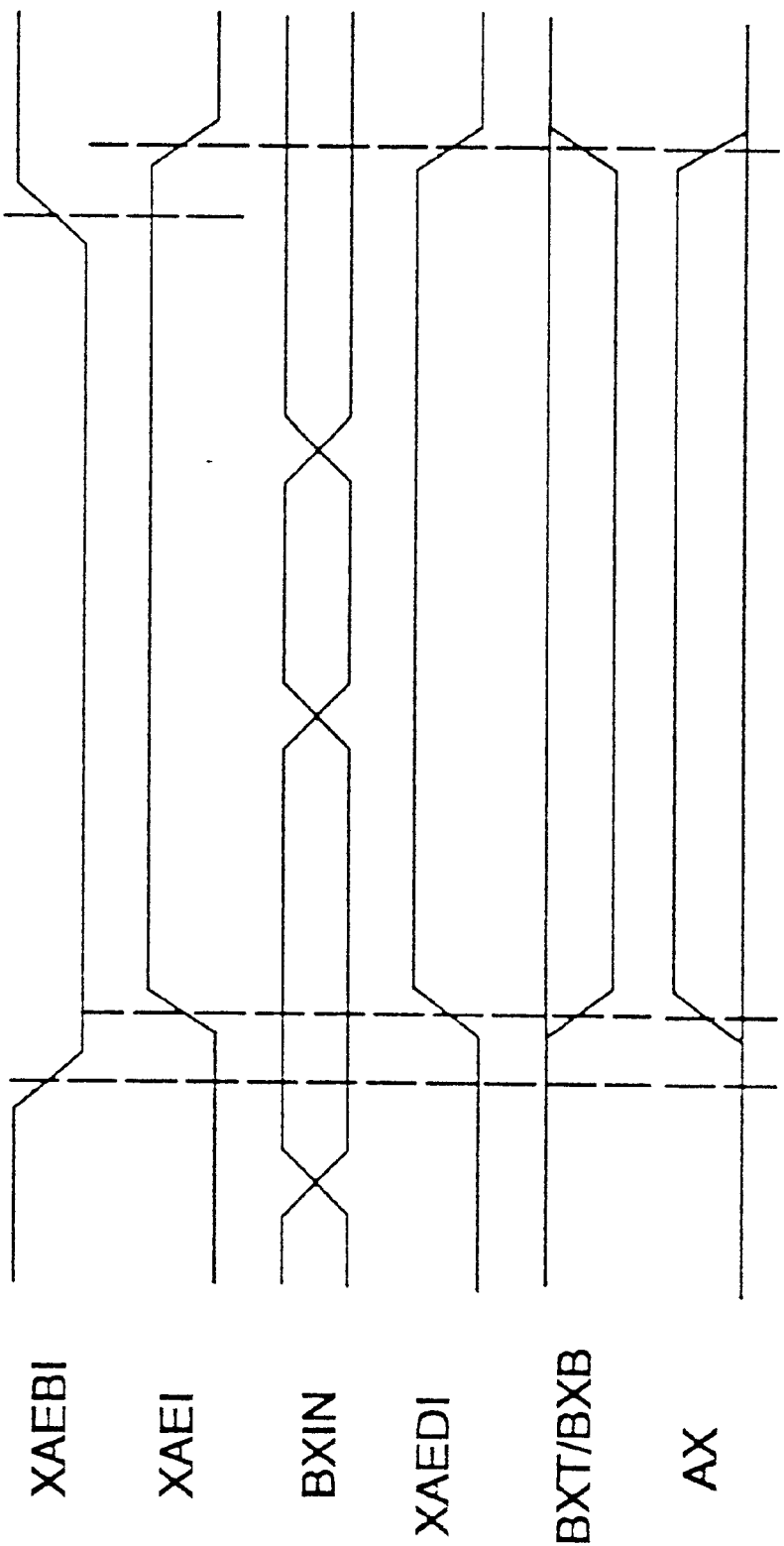
FIG. 5 is a timing diagram that shows operational characteristics of a preferred embodiment an address signal generator and an address decoder in semiconductor memory according to the present invention.

FIG. 5 is a timing diagram that shows operational characteristics of a preferred embodiment of an address generating circuit that includes an address signal generator and an address decoder in a semiconductor memory according to the present invention. Referring to FIG. 5, an address signal generation enabling signal XAEBI goes down to low level while an external address BXIN is confirmed. Accordingly, address signals BXT and BXB are enabled. Then, an address enabling signal XAEI goes up to high level. In this case, logic values of the address signals BXT and BXB are latched as soon as the address enabling signal XAEI goes up to high level because the address signal generation enabling signal XAEBI was previously transitioned. A decoding control signal XAEDI preferably goes up to high level as soon as the address enabling signal XAEI goes to high level.

The logic value of the address signal BXB depends on that of an external address BXIN. BXT and BXB are on low and high levels, respectively, when the external address BXIN is at low level. Otherwise, BXT and BXB are at high and low levels, respectively, when the external address BXIN is on high level. However, once the address enabling signal XAEI goes to low level, the address signals BXT and BXB are fixed to high level regardless of the logic value of the external address BXIN.

Figure 2:
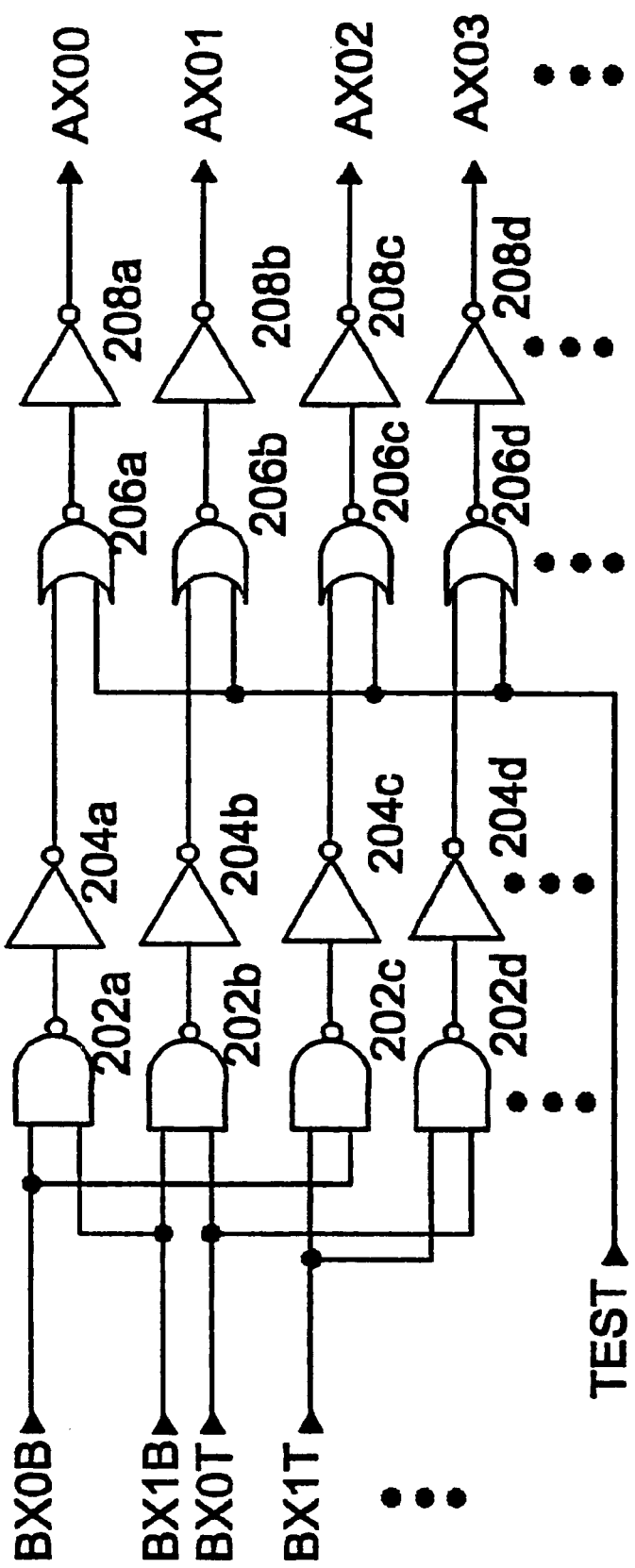
FIG. 2 shows an address decoder in semiconductor memory according to a related art.
Figure 3:
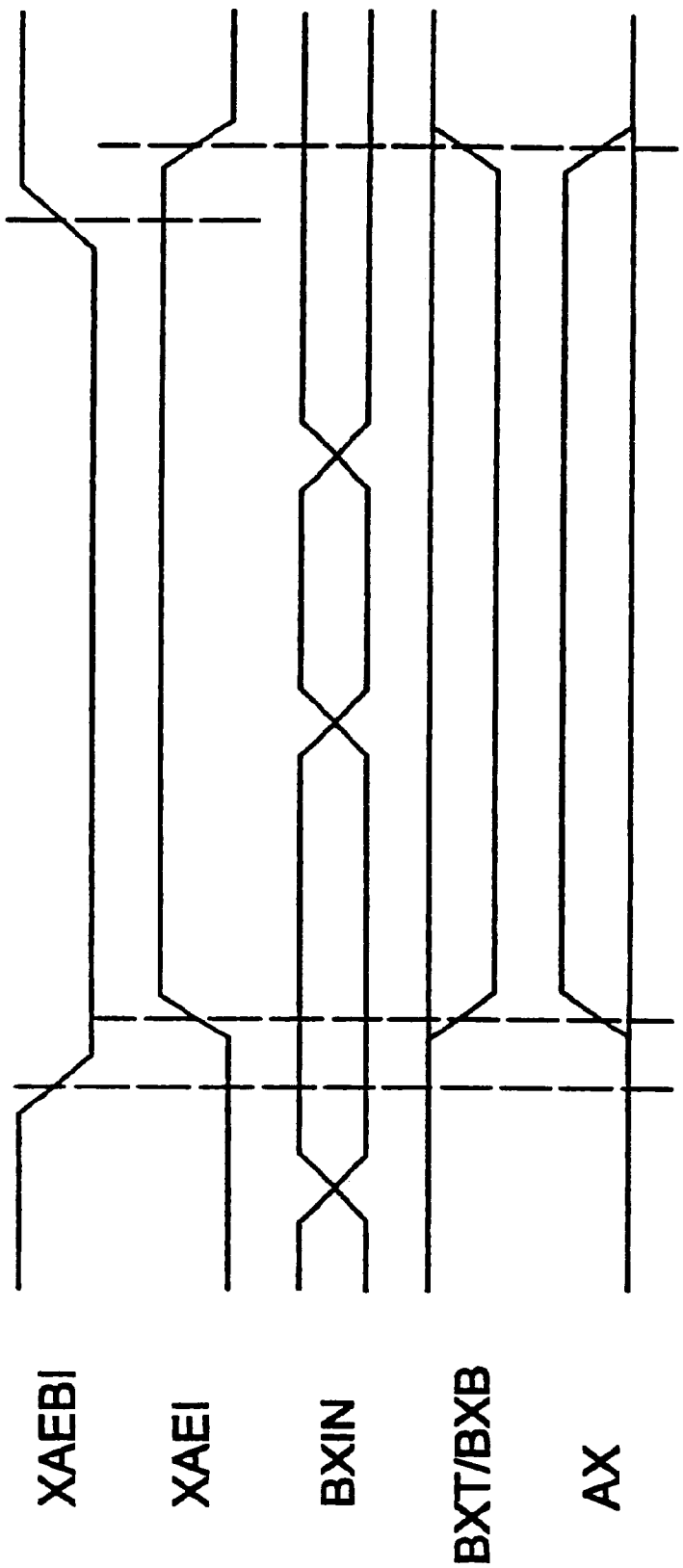
FIG. 3 is a timing diagram of operational characteristics of an address signal generator and an address decoder in a related art semiconductor memory.

An internal address AX is generated from decoding the address signal BXB in a semiconductor memory according to the preferred embodiment of the present invention. As the address signals BXT and BXB are generated, the internal address AX is generated using one of the complementary signals BXnB, BXnT by the preferred embodiment of the decoder as shown in FIG. 4. When the NOR gate 206 in FIG. 2 is not on test mode, an internal signal AX is generated as soon as the address signal BX is generated free from influence of the test signal TEST as shown in FIG. 5. Namely, the preferred embodiment of the decoder of the semiconductor memory in FIG. 4 is enabled by using the decoding control signal XAEDI preferably having the same timing as the address input enabling signal XAEI, while operational speed is improved by activating the address signal generation enabling signal XAEBI earlier than the address input enabling signal XAEI in FIG. 1. Further, an ineffective internal address AX is prevented. The ineffective internal address AX is generated in the related art since the decoder is active while the address signal generation enabling signal XAEBI is activated earlier than the address input enabling signal XAEI.

As described above, the preferred embodiment of the address generating circuit including an address generator and a decoder according to the present invention has various advantages. The preferred embodiment prevents ineffective internal address from being generated by reducing the signal transferring paths between an address signal generator and a decoder as well as by controlling a signal output timing.

The foregoing embodiments and advantages are nearly exemplary and are not to be construed as limiting the present invention. The present teaching can be readily applied to other types of apparatuses. The description of the present invention is intended to be illustrative, and not to limit the scope of the claims. Many alternatives, modifications, and variations will be apparent to those skilled in the art. In the claims, means-plus-function clauses are intended to cover the structures described herein as performing the recited function and not only structural equivalents but also equivalent structures.

What is claimed is:

1. An address generator for a semiconductor memory comprising:

an address signal generator that produces pairs of complementary address signals responsive to receipt of an external address, wherein the external address is input to the address signal generator using a first control and the external address is latched in the address signal generator using a second control signal; and a decoder that generates an internal address by receiving a selected one of each pair of the complementary address signals and by decoding said selected ones of the complementary address signals and its corresponding inverted signal, wherein the decoder is enabled by a third control signal having a logic value equal to the first control signal.

2. The address generator of claim 1, further comprising:

a first inverter; and a latch, wherein the external address is input when the first inverter is enabled by the first control signal, and wherein an output of the first inverter is latched when the latch is enabled by the second control signal.

3. The address generator of claim 2, wherein the latch comprises reverse parallel coupled second and third inverters, wherein an input of the third inverter is coupled to an output of the second inverter, and wherein an input of the second inverter is coupled to an output of the first inverter.

4. The address generator of claim 1, wherein the second control signal is an inverted signal of an address enabling signal, and wherein the first control signal is an inverted signal of the second control signal.

5. The address generator of claim 4, further comprising a delay, wherein the address enabling signal is activated between a set-up time and a holding time of the external address by delaying a bank selection signal using the delay.

6. The address generator of claim 1, wherein the third control signal is activated between an input time of the external address and an activation time of the first control signal.

7. The address generator of claim 1, wherein the decoder is an address decoder that comprises:

a plurality of inverters, wherein each of the inverters receives a corresponding one of the selected complementary address signals;

a plurality of first logic gates, each receiving an output from one of the inverters and one of the selected complementary address signals;

a plurality of second logic gates, each receiving the third control signal and an output signal from a corresponding one of the first logic gates;

a plurality of third logic gates, each receiving a fourth control signal and an output signal from a corresponding one of the second logic gates; and a plurality of fourth logic gates, each receiving an output signal from a corresponding one of the third logic gates, wherein output signals of the fourth logic gate are the internal address.

8. The address generator of claim 1, wherein the decoder comprises a plurality of inverters, wherein each of the inverters receives a corresponding one of the selected complementary address signal to generate the corresponding inverted signal.

9. A semiconductor memory, comprising:

a control signal generator that generates a first control signal that controls an input of an external address and a second control signal that controls a latching of the inputted external address;

a first logic gate that receives the external address when enabled by the first control signal;

a latch that latches an output of the first logic gate when enabled by the second control signal;

an address signal generator that generates complementary address signals using outputs of the first logic gate and the latch when enabled by a third control signal; and a decoder that receives a selected single one of the complementary address signals and generates an internal address by decoding said selected complementary address signal and its inverted signal, wherein the decoder includes an internal address output stage that receives the internal address and a fourth control signal and outputs the internal address to a word line according to the fourth control signal, wherein the decoder is enabled by the fourth control signal having a logic value equal to the first control signal.

10. The semiconductor memory of claim 9, wherein the second control signal is an inverted signal of an address enabling signal and wherein the first control signal is an inverted signal of the second control signal.

11. The semiconductor memory of claim 9, further comprising a memory array coupled to the decoder to receive the internal address, wherein the address enabling signal is activated between a set-up time and a holding time of the external address by delaying a bank selection signal.

12. The semiconductor memory of claim 9, wherein the third control signal is activated between an input time of the external address and an activation time of the first control signal.

13. The semiconductor memory of claim 9, wherein the decoder comprises:

a second logic gate, wherein the second logic gate receives the selected complementary address signal;

a plurality of third logic gates, each receiving one of an output from the second logic gate and the selected complementary address signal;

a plurality of fourth logic gates, each receiving the fourth control signal and an output signal from a corresponding one of the third logic gates;

a plurality of fifth logic gates, each receiving a fifth control signal and an output signal from a corresponding one of the fourth logic gates; and a plurality of sixth logic gates, each receiving an output signal from a corresponding one of the fifth logic gates, wherein output signals of the sixth logic gates are the internal address.

14. The semiconductor memory of claim 13, wherein the second logic gate and the sixth logic gates are inverters, the third logic gates are NAND gates, and the fourth and fifth logic gates are NOR gates.

15. A decoder circuit for use with a semiconductor memory device, comprising a decoder that generates an internal address, wherein the decoder receives only one of each pair of complementary address signals based on an external address for decoding to output the internal address responsive to a first control signal, wherein the decoder generates a prescribed level internal address responsive to a test control signal, and wherein the decoder is an address decoder that comprises:

a plurality of inverters, wherein each of the inverters receives a corresponding one of the selected complementary address signals;

a plurality of first logic gates, each receiving an output from one of the inverters and one of the selected complementary address signals; and a plurality of second logic gates, each receiving a third control signal and an output signal from a corresponding one of the first logic gates.

16. The decoder circuit of claim 15, wherein the address decoder comprises:

a plurality of third logic gates, each receiving a fourth control signal and an output signal from a corresponding one of the second logic gates; and a plurality of fourth logic gates, each receiving an output signal from a corresponding one of the third logic gates, wherein output signals of the fourth logic gates are the internal address.

17. An address generator for a semiconductor memory comprising:

an address signal generator that produces pairs of complementary address signals responsive to receipt of an external address, wherein the external address is input to the address signal generator using a first control signal and the external address is latched in the address signal generator using a second control signal; and a decoder that generates an internal address by receiving a selected one of each pair of the complementary address signals and by decoding said selected ones of the complementary address signals and its corresponding inverted signal, wherein the decoder is an address decoder that comprises:

a plurality of inverters, wherein each of the inverters receives a corresponding one of the selected complementary address signals;

a plurality of first logic gates, each receiving an output from one of the inverters and one of the selected complementary address signals; and a plurality of second logic gates, each receiving a third control signal and an output signal from a corresponding one of the first logic gates.

* * * * *